United States Patent
Ngan et al.

(12) 
(10) Patent No.: US 6,475,356 B1
(45) Date of Patent: *Nov. 5, 2002

(54) METHOD AND APPARATUS FOR IMPROVING SIDEWALL COVERAGE DURING SPUTTERING IN A CHAMBER HAVING AN INDUCTIVELY COUPLED PLASMA

(75) Inventors: Ken Ngan, Fremont, CA (US); Simon Hui, Fremont, CA (US); Seshadri Ramaswami, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/493,700

(22) Filed: Jan. 28, 2000

Related U.S. Application Data

(63) Continuation of application No. 08/753,251, filed on Nov. 21, 1996, now abandoned.

(51) Int. Cl.$^7$ ............................................... C23C 14/34
(52) U.S. Cl. ........................... 204/192.17; 204/192.12; 204/192.13; 204/192.15; 204/298.03; 204/298.06; 204/298.25
(58) Field of Search ....................... 204/192.12, 192.13, 204/192.15, 192.17, 298.03, 298.06, 298.08, 298.23, 298.25, 298.26

(56) References Cited

U.S. PATENT DOCUMENTS

| | | | |
|---|---|---|---|
| 3,594,295 A | 7/1971 | Meckel et al. | 204/298.06 |
| 4,336,118 A | 6/1982 | Patten et al. | 204/192.12 |
| 4,362,632 A | 12/1982 | Jacob | 422/186.04 |
| 4,495,221 A | 1/1985 | Broadbent | |
| 4,626,312 A | 12/1986 | Tracy | 156/345 |
| 4,661,228 A | 4/1987 | Mintz | 204/192.25 |

(List continued on next page.)

FOREIGN PATENT DOCUMENTS

| | | |
|---|---|---|
| EP | 0286158 | 10/1988 |
| EP | 0297502 | 1/1989 |

(List continued on next page.)

OTHER PUBLICATIONS

U.S. Patent application 09/558,457 filed Apr. 25, 2000 by Liu, et al. (41 pages).

(List continued on next page.)

*Primary Examiner*—Rodney G. McDonald
(74) *Attorney, Agent, or Firm*—Konrad Raynes Victor & Mann, LLP

(57) ABSTRACT

Increased sidewall coverage by a sputtered material is achieved by generating an ionizing plasma in a relatively low pressure sputtering gas. By reducing the pressure of the sputtering gas, it is believed that the ionization rate of the deposition material passing through the plasma is correspondingly reduced which in turn is believed to increase the sidewall coverage by the underlayer. Although the ionization rate is decreased, sufficient bottom coverage of the by the material is maintained. In an alternative embodiment, increased sidewall coverage by the material may be achieved even in a high density plasma chamber by generating the high density plasma only during an initial portion of the material deposition. Once good bottom coverage has been achieved, the RF power to the coil generating the high density plasma may be turned off entirely and the remainder of the deposition conducted without the high density plasma. Consequently, it has been found that good sidewall coverage is achieved in the latter part of the deposition.

33 Claims, 5 Drawing Sheets

U.S. PATENT DOCUMENTS

| | | | |
|---|---|---|---|
| 4,692,230 A | 9/1987 | Nihei et al. ............. | 204/192.11 |
| 4,716,491 A | 12/1987 | Ohno et al. ................. | 361/230 |
| 4,717,462 A | 1/1988 | Homma et al. | |
| 4,792,732 A | 12/1988 | O'Loughlin ............... | 315/334 |
| 4,810,342 A | 3/1989 | Inoue | |
| 4,816,126 A | 3/1989 | Kamoshida et al. | |
| 4,818,723 A | 4/1989 | Yen | |
| 4,824,544 A | 4/1989 | Mikalesen et al. | |
| 4,842,703 A | 6/1989 | Class et al. ............ | 204/192.12 |
| 4,844,775 A | 7/1989 | Keeble ......................... | 216/68 |
| 4,865,712 A | 9/1989 | Mintz .................... | 204/298.16 |
| 4,871,421 A | 10/1989 | Ogle et al. ................. | 438/710 |
| 4,874,494 A | 10/1989 | Ohmi .................... | 204/192.12 |
| 4,897,709 A | 1/1990 | Yokoyama et al. | |
| 4,918,031 A | 4/1990 | Flamm et al. .............. | 438/695 |
| 4,925,542 A | 5/1990 | Kidd .......................... | 427/531 |
| 4,941,915 A | 7/1990 | Matsuoka et al. ..... | 204/298.12 |
| 4,944,961 A | 7/1990 | Lu et al. | |
| 4,948,458 A | 8/1990 | Ogle .......................... | 438/729 |
| 4,951,601 A | 8/1990 | Maydan et al. ............. | 118/719 |
| 4,970,176 A | 11/1990 | Tracy et al. | |
| 4,990,229 A | 2/1991 | Campbell et al. ...... | 207/298.06 |
| 4,999,096 A * | 3/1991 | Nihei et al. ............. | 204/192.3 |
| 5,065,698 A | 11/1991 | Koike ........................ | 118/719 |
| 5,091,049 A | 2/1992 | Campbell et al. ............. | 216/37 |
| 5,094,885 A | 3/1992 | Selbrede .................. | 427/248.1 |
| 5,122,251 A | 6/1992 | Campbell et al. ...... | 204/298.06 |
| 5,135,629 A | 8/1992 | Sawada et al. ......... | 204/192.12 |
| 5,146,137 A | 9/1992 | Gesche et al. ........... | 315/111.21 |
| 5,169,684 A | 12/1992 | Takagi ..................... | 427/248.1 |
| 5,175,608 A | 12/1992 | Nihei et al. ................. | 257/751 |
| 5,178,739 A * | 1/1993 | Barnes et al. ........... | 204/192.12 |
| 5,186,718 A * | 2/1993 | Tepman et al. ......... | 204/298.25 |
| 5,192,371 A | 3/1993 | Shuto et al. ................. | 118/728 |
| 5,206,516 A | 4/1993 | Keller et al. .............. | 250/492.2 |
| 5,213,650 A | 5/1993 | Wang et al. .................. | 156/345 |
| 5,223,112 A | 6/1993 | Tepman .................. | 204/298.11 |
| 5,225,740 A | 7/1993 | Ohkawa ................. | 315/111.41 |
| 5,228,501 A | 7/1993 | Tepman et al. ............ | 165/80.1 |
| 5,231,334 A | 7/1993 | Paranjpe ................. | 315/111.21 |
| 5,234,560 A | 8/1993 | Kadlec et al. .......... | 204/192.12 |
| 5,238,499 A | 8/1993 | van de Ven et al. ........ | 118/724 |
| 5,241,245 A | 8/1993 | Barnes et al. ........... | 315/111.41 |
| 5,280,154 A | 1/1994 | Cuomo et al. .......... | 219/121.52 |
| 5,292,393 A * | 3/1994 | Maydan et al. ......... | 204/298.25 |
| 5,304,279 A | 4/1994 | Coultas et al. .............. | 156/345 |
| 5,312,717 A | 5/1994 | Sachdev et al. ............. | 430/313 |
| 5,320,728 A | 6/1994 | Tepman .................. | 204/192.12 |
| 5,330,628 A | 7/1994 | Demaray et al. | |
| 5,346,578 A | 9/1994 | Benzing et al. .............. | 156/345 |
| 5,360,996 A | 11/1994 | Nulman et al. .............. | 257/767 |
| 5,361,016 A | 11/1994 | Ohkawa et al. ......... | 315/111.41 |
| 5,366,590 A | 11/1994 | Kadomura ................... | 438/723 |
| 5,368,685 A | 11/1994 | Kumihashi et al. ........... | 216/70 |
| 5,397,962 A | 3/1995 | Moslehi .................. | 315/111.51 |
| 5,404,079 A | 4/1995 | Ohkuni et al. ........... | 315/111.81 |
| 5,418,431 A | 5/1995 | Williamson et al. .... | 315/111.51 |
| 5,421,891 A | 6/1995 | Campbell et al. ........ | 118/723 R |
| 5,427,668 A | 6/1995 | Sato et al. .............. | 204/298.05 |
| 5,429,070 A | 7/1995 | Campbell et al. ........ | 118/723 R |
| 5,429,710 A | 7/1995 | Akiba et al. ................. | 438/714 |
| 5,429,995 A | 7/1995 | Nishiyama et al. ......... | 438/788 |
| 5,430,355 A | 7/1995 | Paranjpe ................. | 315/111.21 |
| 5,431,799 A * | 7/1995 | Mosely et al. ......... | 204/298.06 |
| 5,443,995 A | 8/1995 | Nulman | |
| 5,500,102 A | 3/1996 | Ichikawa et al. ...... | 204/192.25 |
| 5,503,676 A | 4/1996 | Shuffle botham et al. ....... | 118/723 MR |
| 5,510,011 A | 4/1996 | Okamura et al. ........ | 204/192.3 |
| 5,545,927 A | 8/1996 | Farooq et al. .............. | 257/762 |
| 5,573,595 A | 11/1996 | Dible .................. | 118/723 MP |
| 5,639,357 A * | 6/1997 | Xu ........................... | 204/192.3 |
| 5,683,537 A | 11/1997 | Ishii .......................... | 156/345 |
| 5,707,498 A | 1/1998 | Ngan .................... | 204/192.12 |
| 5,830,331 A | 11/1998 | Kim et al. ............. | 204/192.15 |
| 5,863,393 A | 1/1999 | Hu .......................... | 204/192.3 |
| 5,976,327 A | 11/1999 | Tanaka .................. | 204/192.15 |
| 6,042,700 A | 3/2000 | Gopalraja et al. ..... | 204/192.15 |
| 6,080,285 A * | 6/2000 | Liu et al. ................ | 204/192.12 |
| 6,114,244 A | 9/2000 | Hirose et al. ................ | 438/688 |

FOREIGN PATENT DOCUMENTS

| | | |
|---|---|---|
| EP | 0520519 | 12/1992 |
| EP | 0607797 | 1/1994 |
| EP | 0595624 | 5/1994 |
| EP | 0682361 | 11/1995 |
| EP | 0689038 | 12/1995 |
| EP | 0735577 | 10/1996 |
| EP | 0799903 | 10/1997 |
| EP | 0807954 | 11/1997 |
| EP | 0836219 | 4/1998 |
| GB | 2162365 | 1/1986 |
| GB | 2231197 | 11/1990 |
| JP | 58063139 | 4/1983 |
| JP | 59190363 | 10/1984 |
| JP | 60096755 | 5/1985 |
| JP | 61190070 | 8/1986 |
| JP | 2175864 | 7/1990 |
| JP | 2216822 | 8/1990 |
| JP | 3240944 | 10/1991 |
| JP | 4007847 | 1/1992 |
| JP | 5-129276 | 5/1993 |
| JP | 5-152248 * | 6/1993 ............ 204/192.17 |
| JP | 5283366 | 10/1993 |
| JP | 6232055 | 8/1994 |
| JP | 6283470 | 10/1994 |
| JP | 7176398 | 7/1995 |
| JP | 7176399 | 7/1995 |
| JP | 8288259 | 11/1996 |
| WO | WO860623 | 11/1986 |

OTHER PUBLICATIONS

Singapore Search Report in Application No. 9704107–3 filed Nov. 20, 1997.

EP97309338.8 Search Report dated Oct. 25, 2000 (Atty Dkt 5179).

Cheng, et al. "Directional Deposition of Cu into Semiconductor Trench Structures using Ionized Magnetron Sputtering," J. Vac. Technol. B 13(2), Mar./Apr. 1995, pp. 203–208.

Vossen, J.L. "Control of Film Properties by rf–Sputtering Techniques," J. Vac. Sci. Technol., vol. 8, No. 5, 1971, pp. S12–S30.

EP97309338.8 Search Report dated Mar. 2, 2001 (Atty Dkt 5179).

Kondoh, et al. "Chemical Vapor Deposition of Aluminum from Dimethylaluminumhydride (DMAH): Characteristics of DMAH vaporization and Al Growth Kinetics," J. Vac. Sci. Technol. A 13(6), Nov./Dec. 1995, pp. 2863–2871.

Ossart, et al. "Effect of Metal–Organic Composition Fluctuation on the Atmospheric–Pressure Metal–Organic Vapor Phase Epitaxy Growth of GaAlAs/GaAs and AsInAs/InP Structure," Jap. J. Appl. Physics, 30(1991) May 1, No. 5A, Part 2, Tokyo; pp. 783–785.

Takahashi, Kazuo. Letter re: relevance of particular Japanese patents. Jul. 9, 1997.

U.S. patent application Ser. No. 08/559,345, filed Nov. 15, 1995 (Aty. Dk. 938/PVD/DV) Allow.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

U.S. patent application Ser. No. 08/789,960, filed Jan. 30, 1997 (Aty. Dk. 1643/PVD/DV) 17C1.

U.S. patent application Ser. No. 08/677,588, filed Jul. 9, 1996 (Atty. Dk. 1402/PVD/DV) ABN.

Demaray et al., "Aluminum Alloy Planarization for Topography Control of Multilevel VLSI Interconnect," Proceedings—VLSI and Computers: First International Conference on Computer Technology, Systems and Applications, May 11, 1987.

Park et al., "Influences of D.C. Bias on Aluminum Films Prepared with a High Rate Magnetron Sputtering Cathode," *Thin Solid Films*, 1985.

Hoffman, "Practical Troubleshooting of Vacuum Deposition Processes and Equipment for Aluminum Metallization," *Solid State Technology*, vol. 21, No. 12, pp. 47–56, Dec. 12, 1978.

Hoffman, "Tungsten Titanium Diffusion Barrier Metallization," *Solid State Technology*, vol. 26, No. 6, pp. 119–126, Jun. 6, 1983.

Hoffman et al., "Planarization of Aluminum Alloy Films During High Rate Sputtering," *Thin Solid Films*, vol. 153, pp. 369–377, Oct. 26, 1987.

Ahn et al., Effects of Substrate Temperature on Copper Distribution, Resistivity, and Microstructure in Magnetron–Sputtered Al–Cu Films, *Thin Solid Films*, vol. 153, pp. 409–419, Oct. 26, 1987.

Helmer et al., "Pressure Effects in Planar Magnetron Sputter Deposition," *Journal of Vacuum Science & Technology A (Vacuum, Surfaces, and Films)*, vol. 4, No. 3, pt. 1, pp. 408–412, May–Jun., 1986.

Skelly et al., "Significant Improvement in Step Coverage Using Bias Sputter Aluminum," *J. Vac. Sci. Technol.*, 1986.

Joshi et al., Collimated Sputtering of TiN/Ti Liners into Sub–Half Micron High Aspect Ratio Contacts/Lines, Jun. 9–10, 1992 VMIC Conference 1992, pp. 253–259.

Meikle et al., "Semiconductor Process Considerations for Collimated Source Sputtering of Ti Films," Jun. 9–10, 1992 VMIC Conference, 1992, pp. 289–291.

Van Gogh et al., "Characterization of Improved TiN Films by Controlled Divergence Sputtering," Jun. 9–10, 1992 VMIC Conference, 1992, pp. 310–313.

U.S. Patent application Ser. No. 08/511,825, filed Aug. 7, 1995 (Atty. Dk. 885/PVD/DV).

U.S. Patent application Ser. No. 08/753,251, filed Nov. 21, 1996 (Aty. Dk. 1657/PVD/DV) Rarent.

U.S. patent application Ser. No. 08/647,184, filed May 9, 1996 (Aty. Dk. 1383/PVD/DV) ABN.

U.S. patent application Ser. No. 07/954,860, filed Sep. 30, 1992 (Atty. Dk. 364) ABN.

U.S. patent application Ser. No. 08/461,575, filed Sep. 30, 1992 (Atty. Dk. 364.F1) 5951775.

U.S. patent application Ser. No. 08/310,617, filed Sep. 30, 1992 (Atty. Dk. 364.P1) 5589224.

U.S. patent application Ser. No. 08/567,601, filed Jun. 2, 1995 (Atty. Dk. 364.P2) 5803977.

U.S. patent application Ser. No. 08/647,182, filed May 9, 1996 (Atty. Dk. 1186) ABN.

U.S. patent application Ser. No. 08/733,620, filed Oct. 17, 1996 (Attorney Docket# 1457/PVD/DV) Appeal.

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application Ser. No. 08/931,170, filed Sep. 16, 1997 (Aty. Dk. 1812/PVD/DV) 6023038.

U.S. patent application Ser. No. 08/929,829, filed Sep. 15, 1997 (Aty. Dk. 1730/PVD/DV) 6042700.

U.S. patent application Ser. No. 08/680,335, filed Jul. 10, 1996 (Aty. Dk. 1390–CIP/PVD/DV).

PCT Search Report in PCT/US98/18898 dated Jan. 12, 1999.

US 08/741,708 filed Oct. 31, 1996 (Atty. Dkt. 1590/5178).

\* cited by examiner

METHOD AND APPARATUS FOR IMPROVING SIDEWALL COVERAGE DURING SPUTTERING IN A CHAMBER HAVING AN INDUCTIVELY COUPLED PLASMA

This application is a continuation of application Ser. No. 08/753,251, abandoned which in turn is a continuing prosecution application of the original application filed Nov. 21, 1996, which is incorporated herein by reference.

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched openings including trenches and holes of semiconductor devices having openings with a high depth to width aspect ratio, may not adequately coat the walls of the openings, particularly the bottom walls. If a large amount of material is being deposited, the deposited material can bridge over causing undesirable cavities in the deposition layer. To prevent such cavities, sputtered material can be redirected into substantially vertical paths between the target and the substrate by negatively biasing (or self biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

Although such techniques can reduce the formation of voids, further reduction of void formation is needed.

SUMMARY OF THE PREFERRED EMBODIMENTS

It is an object of the present invention to provide an improved method and apparatus for generating a plasma within a chamber and for sputter depositing a layer which enhances both sidewall and bottom coverage.

These and other objects and advantages are achieved by, in accordance with one aspect of the invention, a plasma generating apparatus in which a layer of titanium, a titanium compound or other suitable deposition material is deposited in such a manner as to increase the coverage of sidewalls of channels, vias and other high aspect ratio openings and structures having a sidewall in a substrate. It has been found that by increasing the sidewall coverage of underlayers, the flow of aluminum or other overlayer materials into the opening is enhanced so as to substantially reduce the formation of voids in the overlayer.

In one embodiment, increased sidewall coverage by an underlayer material is achieved by generating an ionizing plasma in a relatively low pressure precursor or sputtering gas. By reducing the pressure of the sputtering gas, it is believed that the ionization rate (or the directionality or both) of the underlayer deposition material passing through the plasma is correspondingly reduced which in turn is believed to increase the sidewall coverage by the underlayer. Although the ionization rate is decreased, sufficient bottom coverage of the channels by the underlayer material is maintained. Another advantage of reducing the sputtering gas pressure is that the deposition rate of the underlayer material may be increased as well.

In an alternative embodiment, increased sidewall coverage by the underlayer material may be achieved even in a high density plasma chamber by generating the high density plasma only during an initial portion of the underlayer material deposition. It has been found that good bottom coverage may be achieved by ionizing the underlayer deposition material using a high density plasma during the initial portion of the deposition. Once good bottom coverage has been achieved, the RF power to the coil generating the high density plasma may be turned off entirely and the remainder of the underlayer deposition conducted without the high density plasma. It has been found that good sidewall coverage is then achieved in the latter part of the deposition. Consequently, good overall coverage of the opening is achieved combining the bottom coverage of the initial portion of the deposition with the sidewall coverage obtained during the latter portion of the underlayer deposition.

DETAILED DESCRIPTION OF THE DRAWINGS

Figure 1:
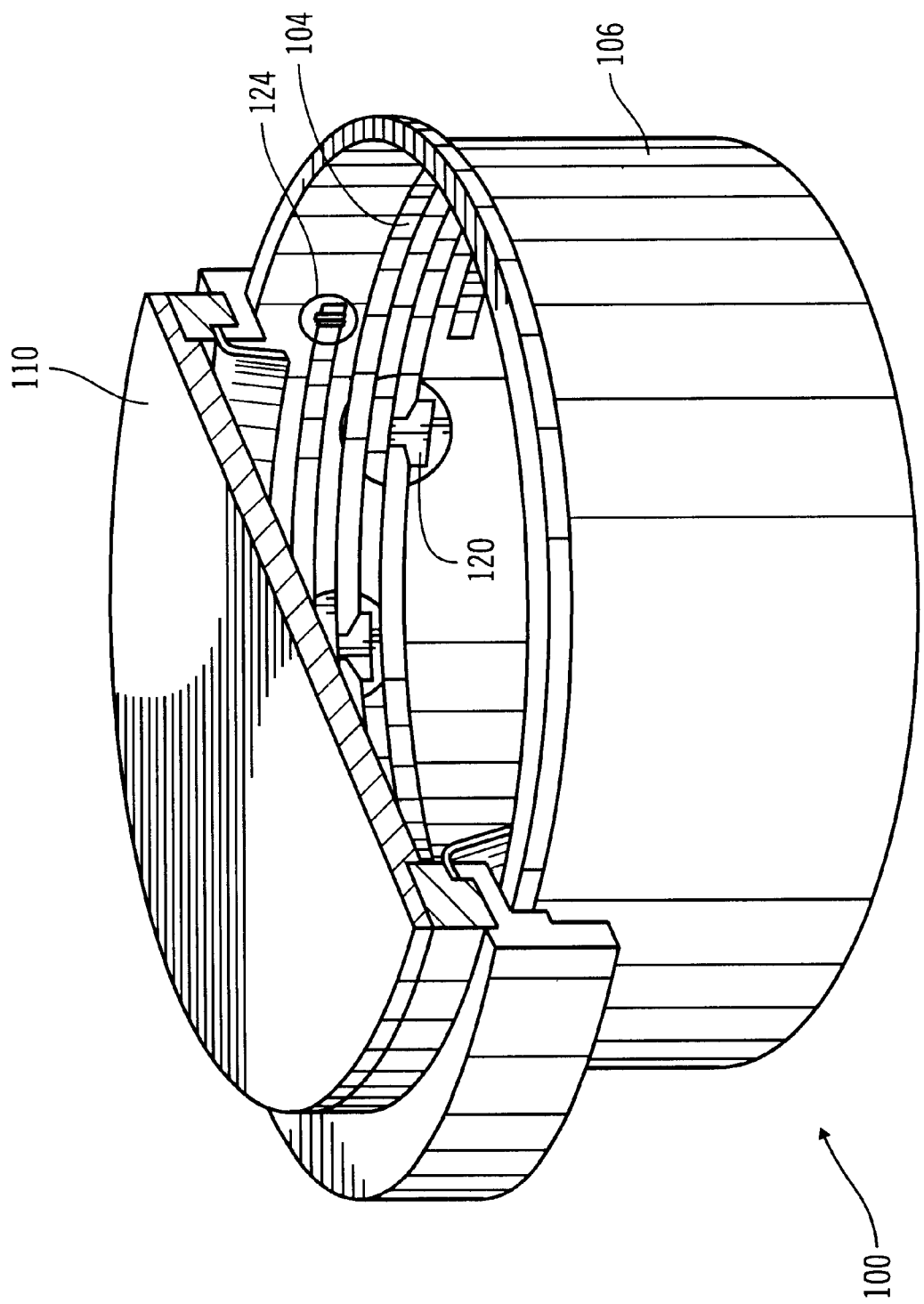
FIG. 1 is a perspective, partial cross-sectional view of a plasma generating chamber for improving sidewall coverage in a manner in accordance with an embodiment of the present invention.
Figure 2:
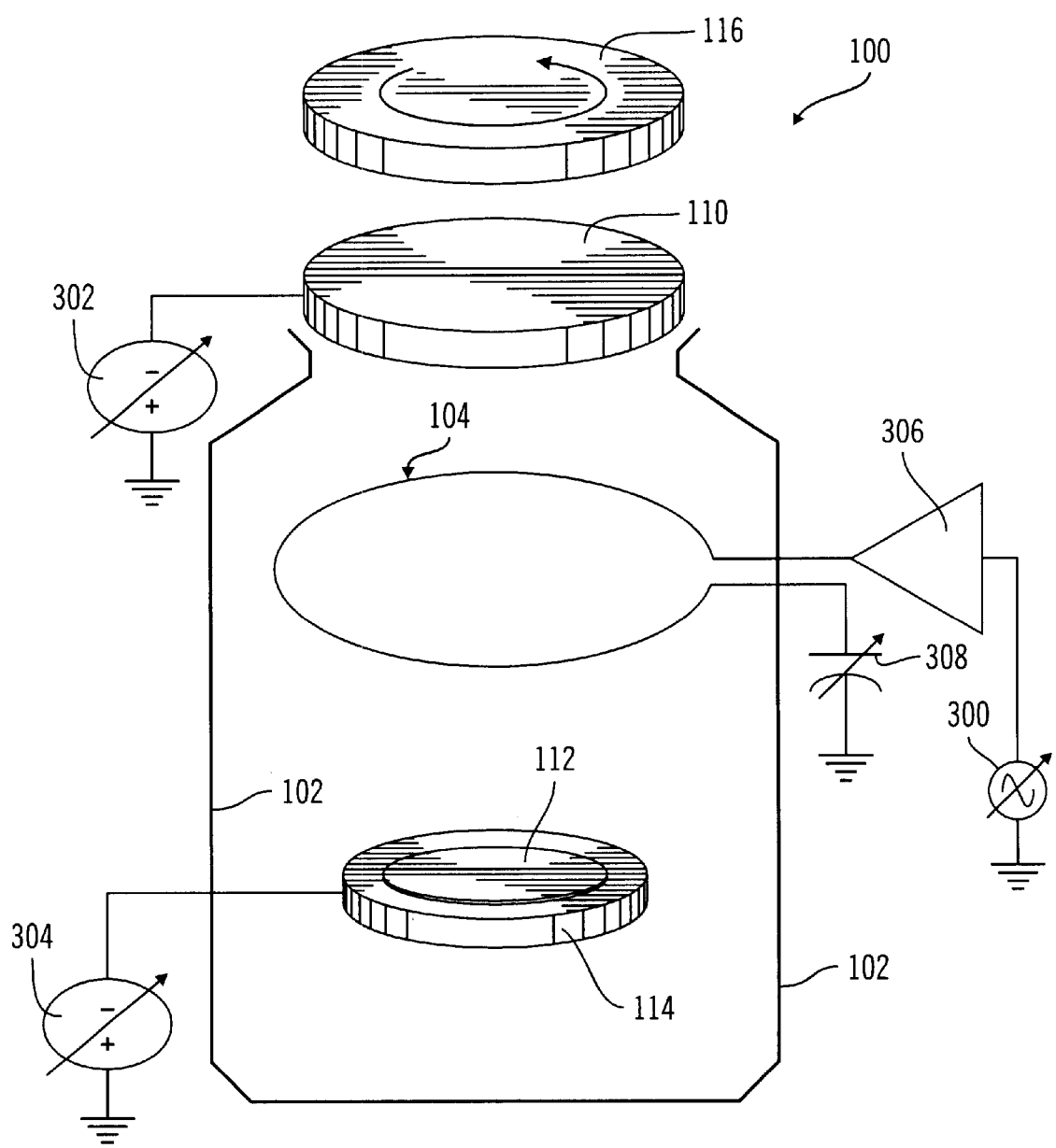
FIG. 2 is a schematic diagram of the electrical interconnections to the plasma generating chamber of FIG. 1.

Referring first to FIGS. 1–2, an example of a plasma generator used in accordance with an embodiment of the present invention comprises a substantially cylindrical plasma chamber 100 which is received in a vacuum chamber 102 (FIG. 2). The plasma chamber 100 of this embodiment has a single helical coil 104 which is carried internally of the vacuum chamber walls by a chamber shield 106. The chamber shield 106 protects the interior walls of the vacuum chamber 102 from the material being deposited within the interior of the plasma chamber 100.

Radio frequency (RF) energy from an RF generator 300 (FIG. 2) is radiated from the coil 104 into the interior of the plasma chamber 100, which energizes a plasma within the plasma chamber 100. An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate.

As will be explained in greater detail below, in accordance with one aspect of the present invention, the ionization of the deposition material is controlled so as to improve the sidewall coverage of openings or other structures having sidewalls while maintaining good bottom coverage as well. Such an arrangement is particularly useful when depositing an underlayer for an interconnect layer of a metal such as aluminum. For example, the improved sidewall coverage of the underlayer has been found to significantly facilitate the flow of aluminum into the channel, even when the aluminum is not ionized, so as to significantly reduce the incidence of undesirable voids forming in the aluminum layer.

A deposition process in accordance with the present invention is useful for a variety of underlayers including wetting layers, seed layers, nucleation layers and barrier layers formed from a variety of deposition materials including aluminum, copper, tungsten, tungsten fluoride, titanium, titanium nitride and tantalum nitride. In addition, any structure having a sidewall can benefit this process including capacitor electrodes formed of a number of electrode materials including titanium and platinum. The process may be used to deposit ferroelectrics including BST (barium strontium titanate) and PZT (lead zirconium titanate) and conductors including aluminum, copper and gold.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may be negatively biased by a variable DC power source 304 to bias the substrate 112 negatively to attract the ionized deposition material to the substrate 112. In an alternative embodiment, the pedestal 114 may be biased by a high frequency RF power source to bias the substrate 112 so as to attract the ionized deposition material more uniformly to the substrate 112. In yet another alternative embodiment, as set forth in copending application Ser. No. 08/677,588, entitled "A Method for Providing Full-face High Density Plasma Physical Vapor Deposition," filed Jul. 9, 1996 and assigned to the assignee of the present application, an external biasing of the substrate 112 may be omitted.

One end of the coil 104 is coupled to an RF source such as the output of an amplifier and matching network 306, the input of which is coupled to the RF generator 300. The other end of the coil 104 is coupled to ground, preferably through a capacitor 308, which may be a variable capacitor.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124. The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall 126 of the shield. The feedthrough is coupled to the RF generator 300 (shown schematically in FIG. 2) through the matching network 306 (also shown schematically in FIG. 2).

As set forth above, the RF power radiated by the coil 104 energizes the plasma in the chamber to ionize the target material being sputtered from the target 110. The ionized sputtered target material is in turn attracted to the substrate 112 which is at a negative (DC or RF) potential to attract the ionized deposition material to the substrate 112.

Figure 3:
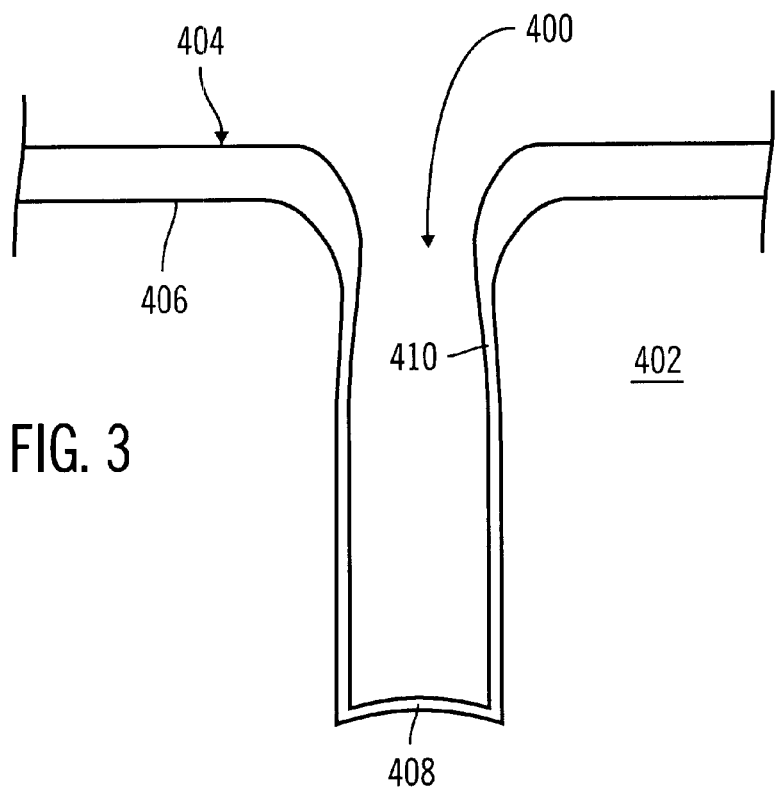
FIG. 3 is a cross-sectional view of an opening having an underlayer of deposition material deposited in a high density plasma.
Figure 4:
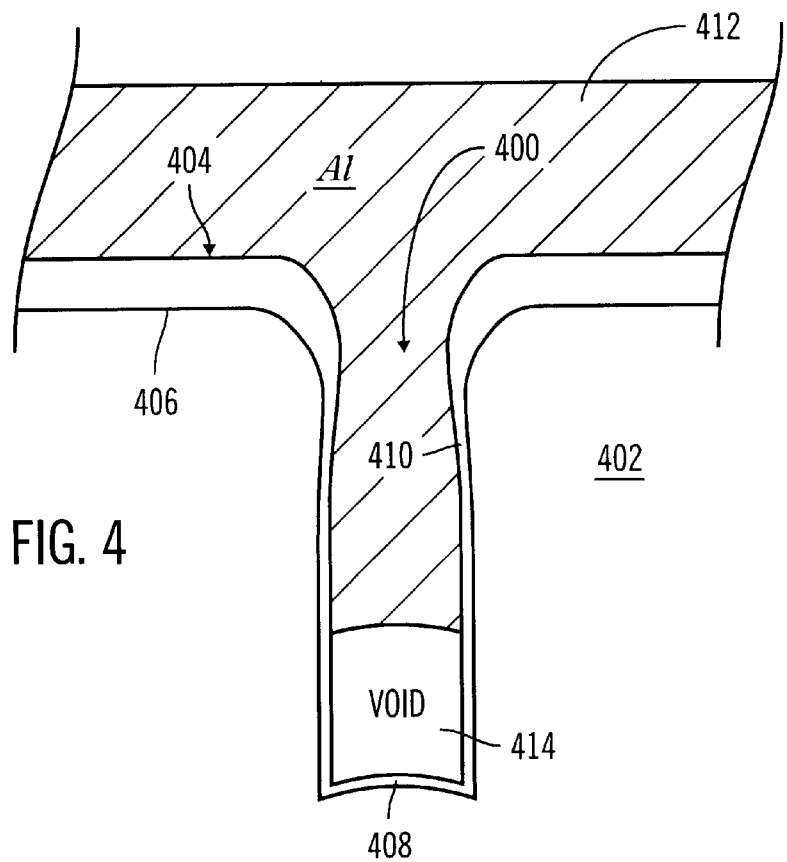
FIG. 4 is a cross-sectional view of the opening of FIG. 3 having an interconnect layer deposited over the underlayer of FIG. 3.

FIG. 3 shows in cross section an opening 400 in an oxide layer 402 of a substrate in which an underlayer 404 of titanium has been deposited. The opening 400 may be a via, channel or other structure having a sidewall or a narrow cross-sectional width (1 micron or less, for example) and a high depth to width aspect ratio. In the example of FIG. 4, the opening has a width of approximately 0.34 microns and a depth to width aspect ratio of approximately 3. Absent ionization, much of the titanium atoms arriving on the surface 406 of the substrate would be at angles too oblique to penetrate very deeply into the opening 400. Consequently, to increase the amount of material entering the opening 400, titanium sputtered from the target 110 is preferably ionized by the plasma in the chamber so that the path of travel of at least some of the deposition material is more vertically aligned so as to reach the bottom of the opening 400.

In the deposition of the titanium underlayer 404 of FIG. 4, the pressure of the argon precursor or sputtering gas was approximately 30 mTorr, a typical value for high density plasma sputtering. Although the ionization of the titanium at this pressure permits very good bottom coverage as indicated by the bottom portion 408 of the underlayer 404, it has been found that the resultant sidewall coverage can be very thin as indicated by the side wall portion 410 of the underlayer 404, or even discontinuous. It is believed that sidewall coverage this thin hinders the interaction between the titanium underlayer 404 and the subsequently deposited aluminum interconnect layer 412 (FIG. 4) such that voids 414 form in the aluminum layer at an undesirable rate.

Figure 5A:
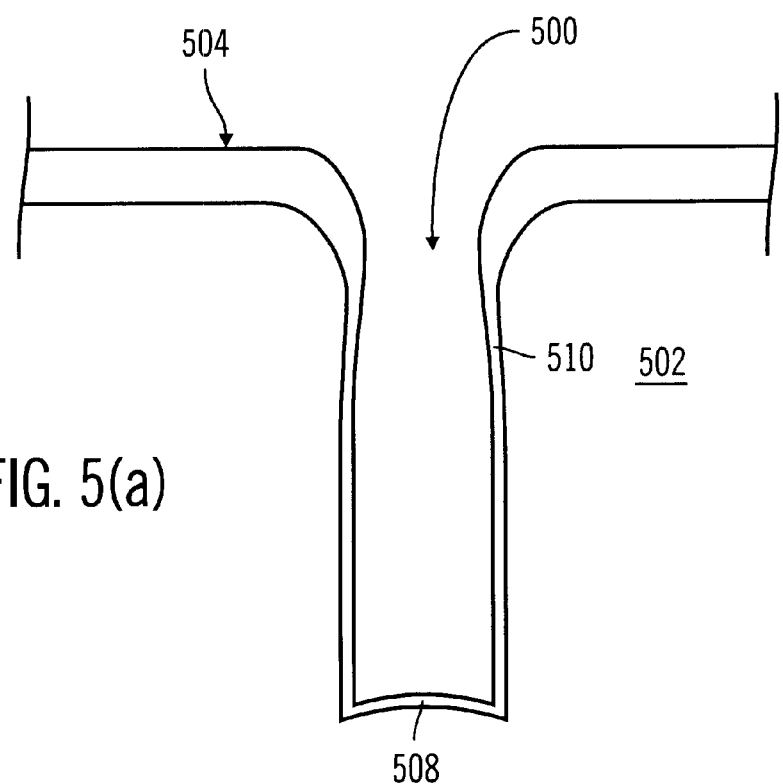
FIG. 5(a) is a cross-sectional view of an opening deposited with an underlayer of deposition material in a low pressure plasma in accordance with the present invention.

It has been found that the sidewall coverage of the underlayer may be significantly improved by generating the ionizing plasma at a pressure substantially below the pressures typically used in high density plasma sputterings. FIG. 5(a) shows an opening 500 in an oxide layer 502 of a substrate in which an underlayer 504 of titanium has been deposited in a plasma generated at an argon sputtering gas pressure of 5 mTorr rather than 30 mTorr. As shown in FIG. 5(a), very good bottom coverage as indicated by the bottom portion 508 has been maintained yet the sidewall coverage has been substantially thickened as indicated by the side wall portion 510 of the underlayer 504. (The relative proportions of the underlayer 504 are not shown to scale in FIG. 5(a) but are exaggerated for purposes of clarity.) This improved sidewall coverage is believed to result from a decrease in the ionization rate of the titanium by the plasma. Because the plasma is generated in a lower pressure argon sputtering gas, it is believed that fewer argon ions and electrons are generated in the plasma such than fewer atoms of the titanium are ionized prior to depositing on the substrate. As a consequence, the angle of incidence of the titanium atoms is, on average, more oblique such that an increased percentage of the titanium is deposited on the sidewall rather than the bottom of the opening 500. Nonetheless, a sufficient amount of the titanium is ionized so as to ensure adequate bottom coverage of the opening 500 as well. It is believed that both good sidewall and good bottom coverages may be achieved at other sputtering gas pressures below 30 mTorr including 20 and 10 mTorr.

Figure 5B:
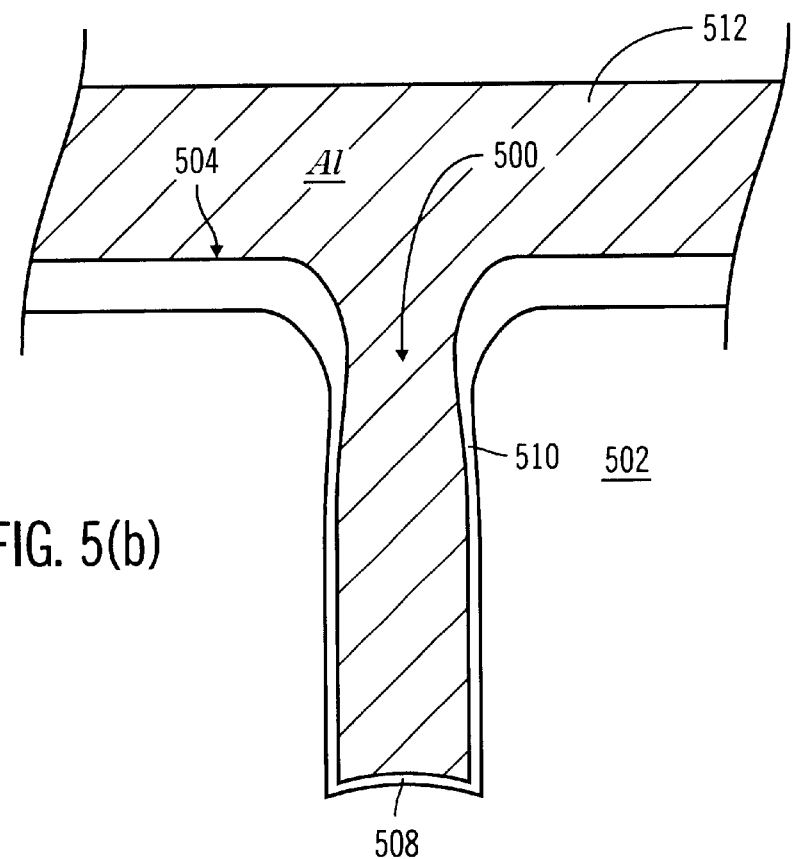
FIG. 5(b) is a cross-sectional view of the opening of FIG. 5(a) having an interconnect layer deposited over the underlayer of FIG. 5(a).

FIG. 5(b) shows an aluminum interconnect layer 512 deposited onto the titanium underlayer 504. Because of the improved sidewall coverage of the underlayer 504, the aluminum interaction with the titanium underlayer 504 is improved such that the opening more frequently fills completely without forming a void. Resistances of aluminum interconnect layers deposited in vias of test wafers in which the underlying titanium layers were deposited at pressures of 10 mTorr and 20 mTorr have shown remarkable decreases over those in which the underlying titanium layers were deposited at 30 mTorr. It is believed that the substantial improvement in resistance is a result of a substantial reduction in the number of voids in the aluminum layer in the vias as a result of improved sidewall coverage by the titanium underlayer.

Although the improved process of the illustrated embodiment has been described in connection with a titanium underlayer and an aluminum overlayer, it should be appreciated that the present invention is applicable to enhancing sidewall coverage of wetting layers, seed layers and nucleation layers of other types of materials. For example, the process may be applied to enhance the sidewall coverage of under layers formed of titanium nitride, tantalum and tantalum nitride for aluminum fill and copper barrier layers. Other applications include enhancing the sidewalls of seed layers of aluminum or copper for subsequent depositions of nonionized aluminum or copper, respectively. Still other examples include improving sidewall coverage of tungsten nucleation layers as part of a CVD (chemical vapor deposition) process. Further structures which can benefit from the process of the present invention include electrodes of devices such as capacitors and other conductors.

In an alternative embodiment, the underlayer for the overlying interconnect layer may be formed in a two-step process in which, in the first step, an initial portion of the underlayer is deposited in a high pressure (e.g. 30 mTorr) plasma with RF power being applied to the coil 104 at a relatively high level such as 1500 watts, for example. As a result, the initial portion of the underlayer will look substantially like the underlayer depicted in FIG. 3 in which good bottom coverage is achieved but the sidewall coverage is relatively thin. However, before the deposition of the underlayer is completed, in a second step, the RF power to the coil 104 may be substantially reduced or even turned off so as to reduce or eliminate ionization of the material being deposited. As a consequence the amount of deposition material being deposited onto the substrate at oblique angles will be increased after the RF power to the coil is turned off which will in turn enhance the sidewall coverage of the openings in a manner similar to that depicted in FIG. 5(a). in this manner, the bottoms of the openings are preferentially deposited in the first step and the sidewalls are preferentially deposited in the second step so as to achieve a good overall coating of both the bottoms and sidewalls forming the underlayer. During the second step, the pressure may be maintained at the full 30 mTorr level or alternatively, since ionization of the deposition material is reduced or eliminated, the pressure may be reduced substantially so as to reduce scattering and increase the deposition rate onto the substrate.

Figure 6:
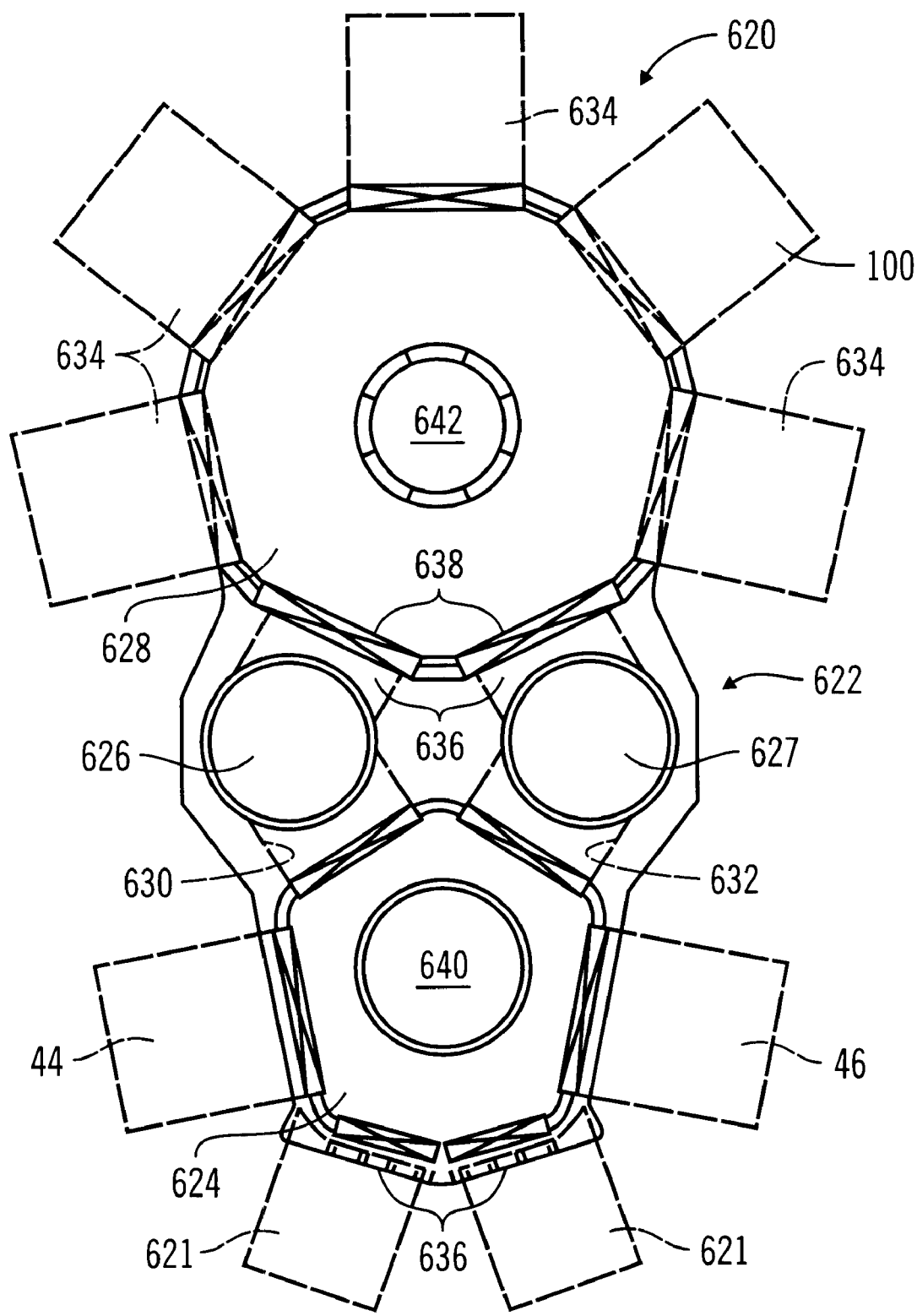
FIG. 6 is a schematic top plan view of a staged-vacuum, multiple chamber semiconductor wafer processing system incorporating the vacuum chamber of FIGS. 1–2.

FIG. 6 is a schematic plan view of a staged-vacuum semiconductor wafer processing system 620 of the type which is described in greater detail in U.S. Pat. No. 5,186,718. The system 620 includes a housing 622 which defines four chambers: a robot buffer chamber 624 at one end, a transfer robot chamber 628 at the opposite end, and a pair of intermediate processing or treatment chambers 626 and 627. Although one or more load lock chambers 621 may be used, preferably two or three such chambers are mounted to the buffer chamber and in communication with the interior of the buffer robot chamber via access ports 636 and associated slit valves 638. A plurality of vacuum processing chambers 634 (including the chamber 100 described above) are mounted about the periphery of the transfer robot station. The chambers 634 may be adapted for various types of processing including etching and/or deposition. Access is provided to and between each of the chambers by an associated port 636 and gate valve 638.

The robot chambers 624 and 628 communicate with one another via the intermediate processing or treatment chambers 626 and 627 (also called "treatment" chambers). Specifically, intermediate treatment chamber 626 is located along a corridor or pathway 630 which connects the transfer robot chamber 628 to the buffer robot chamber 624. Similarly, the second intermediate treatment chamber 627 is located along a separate corridor or pathway 632 which connects the robots 628 and 624. These separate paths between the two robot or transfer chambers permit one path to be used for loading or unloading while the system is being used for wafer processing treatment and, thus, provide increased throughput. The chambers 626 and 627 can be dedicated to pre-treating (e.g., plasma etch cleaning and/or heating) of the wafers before processing in chambers 634 or post-treating (e.g., cool-down) of the wafers following treatment in chambers 634; alternatively, one or both of the chambers 626 and 627 can be adapted for both pre-treatment and post-treatment.

Preferably, the housing 622 is a monolith, i.e., it is machined or otherwise fabricated of one piece of material such as aluminum to form the four chamber cavities 624, 626, 627 and 628 and the interconnecting corridors or pathways 630 and 632. The use of the monolith construction facilitates alignment of the individual chambers for wafer transport and also eliminates difficulties in sealing the individual chambers.

One typical operational cycle of wafer transport through the system 20 is as follows. Initially, an R THETA buffer robot 640 in chamber 624 picks up a wafer from a cassette load lock 621 and transports the wafer to chamber 626 which illustratively etch cleans the surface of the wafer. R THETA transfer robot 642 in chamber 628 picks up the wafer from the pre-cleaning chamber 626 and transfers the wafer to a selected one of the preferably high vacuum processing chambers 634. One of these chambers is the chamber 100 which deposits an underlayer of titanium or other suitable material as set forth above. Following processing, transfer robot 642 can transfer the wafer selectively to one or more of the other chambers 634 for processing. Included amongst these chambers is a deposition chamber which deposits aluminum or other suitable interconnect material on the underlayer previously deposited in the chamber 100. Because the underlayer has good sidewall as well as bottom coverage, the chamber depositing the aluminum may be a conventional magnetron sputtering chamber which does not have an RF coil to produce a high density plasma to ionize the aluminum. Instead, the aluminum may be deposited without being ionized yet can form an interconnect layer having a relatively low resistance with few or no voids in the openings. Upon completion of depositions and etchings, the transfer robot 642 transfers the wafer to intermediate processing chamber 627 which illustratively is a cool-down chamber. After the cool-down cycle, buffer robot 640 retrieves the wafer from the chamber 627 and returns it to the appropriate cassette load lock chamber 621.

The buffer robot 640 may be any suitable robot such as the dual four-bar link obot disclosed in allowed Maydan et. al. patent application, entitled "Multi-Chamber Integrated Process System", U.S. application Ser. No. 283,015, now abandoned, which application is incorporated by reference. The transfer robot 642 likewise may be any suitable robot such as the robot described in the aforementioned U.S. Pat. No. 5,186,718.

The control functions described above for the system 600 including the control of power to the RF coils, targets and substrates, robot control, chamber venting and pumping control, and cassette indexing are preferably provided by a workstation (not shown) programmed to control these system elements in accordance with the above description.

In each of the embodiments discussed above, a multiple turn coil 104 was used, but, of course, a single turn coil may be used instead. Still further, instead of the ribbon shape coil 104 illustrated, each turn of the coil 104 may be implemented with a flat, open-ended annular ring as described in copending application Ser. No. 08/680,335, entitled "Coils for Generating a Plasma and for Sputterng," filed Jul. 10, 1996 and assigned to the assignee of the present appli which application is incorporated herein by reference in its entirety.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No. 08/559,345, filed Nov. 15, 1995 and entitled "Method And Apparatus For Launching a Helicon Wave in a Plasma".

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 4 MHz. An RF power setting of 1.5 kW is preferred but a range of 1.5–5 kW is satisfactory. In addition, a DC power setting for biasing the target 110 of 5 kW is preferred but a range of 2–10 kW and a pedestal 114 bias voltage of −30 volts DC is satisfactory.

A variety of sputtering gases may be utilized to generate the plasma including Ar, $H_2O$ or reactive gases such as $NF_3$, $CF_4$ and many others. Various sputtering gas pressures are suitable including pressures of 0.1–50 mTorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A process for sputter depositing a layer of material into a workpiece structure having a sidewall, comprising:
   providing a sputtering gas into a chamber;
   applying RF power to a coil to ionize the sputtering gas to form a plasma;
   sputtering a target to direct sputtered target material toward a workpiece;
   ionizing a first portion of said sputtered target material at a first ionization level before it is deposited onto said workpiece; and
   ionizing a second portion of said target material at a second ionization level before it is deposited onto said workpiece.

2. The process of claim 1 wherein said sputtering gas during said ionizing of said second portion is at a pressure of 5–10 mTorr.

3. The process of claim 1 wherein said target material is selected from the group consisting of titanium, tantalum, aluminum, copper and tungsten.

4. The process of claim 3 wherein said target material is a compound of nitrogen and a material selected from the group consisting of tantalum and titanium.

5. The process of claim 1 wherein said ionizings of said first and second portions of said target material are in the same chamber.

6. The process of claim 1 wherein said second ionization level of ionizing said second portion includes zero ionization.

7. The process of claim 1 wherein said ionization of said second portion includes reducing said RF power to said coil.

8. The process of claim 7 wherein said ionization of said first portion precedes said ionizing of said second portion.

9. The process of claim 7 wherein said RF power reducing includes reducing said RF power to said coil to zero.

10. The process of claim 1 wherein said sputtering gas during said ionization of said second portion is at a pressure below 20 mTorr.

11. The process of claim 10 wherein said ionizing of said first portion precedes said ionizing of said second portion.

12. The process of claim 1 wherein said sputtering is continuous during said first and second ionizings.

13. The process of claim 1 wherein said second portion ionizing includes reducing said RF power to said coil and reducing a pressure of a precursor gas.

14. A process for sputter depositing a layer of material into a via or channel of a workpiece, comprising:
providing a sputtering gas into a chamber;
applying RF power to a coil to ionize the sputtering gas to form a plasma;
sputtering a target to direct sputtered target material toward a workpiece;
ionizing a portion of said sputtered target material before it is deposited onto said workpiece;
reducing said RF power to said coil while continuing sputtering of said target so as to reduce ionization of said sputtered target material before it is deposited onto said workpiece.

15. The process of claim 14 wherein said reducing of said RF power reduces said RF power to zero.

16. A process for sputter depositing a layer of material into an opening of a workpiece, said opening having a bottom and sidewalls, said process comprising:
sputtering a target to direct sputtered target material toward a workpiece;
ionizing a portion of said sputtered target material before it is deposited onto said workpiece so that sputtered target material which is deposited in said opening is deposited primarily on the bottom of said opening; and
reducing said ionizing of said portion of said sputtered target material so that sputtered target material deposited in said opening is deposited primarily on the sidewalls of said opening.

17. The process of claim 16 wherein said reducing said ionizing reduces ionization of sputtered material to zero.

18. The process of claim 16 wherein a sputtering gas is utilized at a pressure of 5–10 mTorr.

19. The process of claim 16 wherein said target material is selected from the group consisting of titanium, tantalum, aluminum, copper and tungsten.

20. A process for sputter depositing layers of materials into a workpiece structure having a sidewall and a bottom, comprising:
sputtering a first target in a first chamber to direct sputtered first target material toward a workpiece;
ionizing a portion of said sputtered first target material before it is deposited onto said workpiece so that sputtered first target material which is deposited on said structure is deposited primarily on the bottom of said structure; and
reducing said ionizing of said sputtered first target material so that sputtered first target material deposited on said structure is deposited primarily on the sidewalls of said structure;
transferring said workpiece to a second chamber;
sputtering a second target to sputter a second target material onto said structure of said workpiece to deposit on top of said first target material deposited on said structure.

21. The process of claim 20 wherein a sputtering gas is utilized at a pressure of 5–10 mTorr.

22. The process of claim 20 wherein said first target material is selected from the group consisting of titanium, tantalum, aluminum, copper and tungsten.

23. The process of claim 20 wherein said second target material is selected from the group consisting of aluminum and copper.

24. A process for sputter depositing layers of materials into a via or channel of a workpiece, comprising:
providing a sputtering gas into a chamber;
applying RF power to a coil to ionize the sputtering gas to form a plasma;
sputtering a first target to direct sputtered first target material toward a workpiece;
ionizing a first portion of said sputtered first target material at a first level before it is deposited onto said workpiece;
ionizing a second portion of said first target material at a second level before it is deposited onto said workpiece;
transferring said workpiece to a second chamber; and
sputtering a second target to sputter a second target material toward said workpiece.

25. The process of claim 24 wherein said sputtering gas is at a pressure of 5–10 mTorr.

26. The process of claim 24 wherein said first target material is selected from the group consisting of titanium, tantalum, aluminum, copper and tungsten.

27. The process of claim 24 wherein said second target material is selected from the group consisting of aluminum and copper.

28. An apparatus for energizing a plasma within a semiconductor fabrication system to direct sputtered material onto a workpiece, the apparatus comprising:
a semiconductor fabrication chamber having a plasma generation area within said chamber and containing a sputtering gas;
a coil carried by said chamber and positioned to couple energy into said plasma generation area to ionize said sputtered material; and
a controller for controlling said ionization to ionize a first portion of said sputtered material at a first level before it is deposited onto said workpiece and to ionize a second portion of said sputtered material at a second level before it is deposited onto said workpiece.

29. The apparatus of claim 28 including a target including a target material selected from the group consisting of titanium, tantalum, aluminum, copper and tungsten.

30. A semiconductor fabrication system for sputtering multiple layers of materials onto a workpiece, the system comprising:
a first semiconductor fabrication chamber having a plasma generation area within said chamber and containing a sputtering gas;
said first chamber having a first target of a first target material which includes a material selected from the group consisting of titanium, tantalum, aluminum, copper and tungsten, said first target providing a source of sputtered first target material;

a coil carried by said first chamber and positioned to couple energy into said plasma generation area to ionize said first target material sputtered from said target to form an underlayer of said first material on said workpiece;

a controller for controlling said ionization to ionize a first portion of said sputtered first target material at a first level before it is deposited onto said workpiece and to ionize a second portion of said sputtered first target material at a second level before it is deposited onto said workpiece a second semiconductor fabrication chamber; and said second chamber having a second target of a second target material which includes a material selected from the group consisting of aluminum and copper, for forming a layer on said underlayer.

31. An apparatus for energizing a plasma within a semiconductor fabrication system to sputter material onto a workpiece, the apparatus comprising:

a semiconductor fabrication chamber having a plasma generation area within said chamber;

a coil carried by said chamber and positioned to couple energy into said plasma generation area to ionize said material prior to deposition onto said workpiece;

an RF generator coupled to said coil to provide RF power to said coil; and control means for controlling said RF generator to provide power at a level during an initial portion of a sputter deposition and to provide power at a reduced level including zero power in a subsequent portion of said sputter deposition.

32. The apparatus of claim 31 including a target including a material selected from the group consisting of titanium, tantalum, aluminum, copper and tungsten.

33. A semiconductor fabrication system for sputtering multiple layers of materials onto a workpiece, the system comprising:

a first semiconductor fabrication chamber having a plasma generation area within said chamber and a target of a first target material which includes a material selected from the group consisting of titanium, tantalum, aluminum, copper and tungsten;

a coil carried by said chamber and positioned to couple energy into said plasma generation area to ionize said first target material prior to deposition onto said workpiece;

an RF generator coupled to said coil to provide RF power to said coil; and control means for controlling said RF generator to provide power at a level during an initial portion of a sputter deposition and to provide power at a reduced level including zero power in a subsequent portion of said sputter deposition;

a second semiconductor fabrication chamber; and said second chamber having a second target of a second target material which includes a material selected from the group consisting of aluminum and copper, for forming a layer on said underlayer.

* * * * *